(12) United States Patent
Saga

(10) Patent No.: US 6,791,173 B2
(45) Date of Patent: Sep. 14, 2004

(54) SEMICONDUCTOR DEVICE AND ITS MANUFACTURING METHOD

(75) Inventor: Toru Saga, Akita (JP)

(73) Assignees: Hitachi, Ltd., Tokyo (JP); Akita Electronics Systems Co., Ltd., Akita (JP)

( * ) Notice: Subject to any disclaimer, the term of this patent is extended or adjusted under 35 U.S.C. 154(b) by 0 days.

(21) Appl. No.: 10/441,123

(22) Filed: May 20, 2003

(65) Prior Publication Data

US 2003/0218262 A1 Nov. 27, 2003

(30) Foreign Application Priority Data

May 21, 2002 (JP) ...................................... P2002-146241

(51) Int. Cl.⁷ .............................................. H01L 23/02
(52) U.S. Cl. ...................... 257/678; 257/787; 257/784; 257/737; 257/738
(58) Field of Search ................................ 257/678, 787, 257/784, 737, 738; 438/108, 125, 126

(56) References Cited

U.S. PATENT DOCUMENTS

| | | | | |
|---|---|---|---|---|
| 6,091,140 A | * | 7/2000 | Toh et al. ................... | 257/691 |
| 6,258,632 B1 | * | 7/2001 | Takebe ...................... | 438/127 |
| 6,281,571 B1 | * | 8/2001 | Takashima et al. ......... | 257/698 |
| 6,621,170 B2 | * | 9/2003 | Yamamoto et al. ......... | 257/783 |
| 6,692,991 B2 | * | 2/2004 | Minamio et al. ........... | 438/123 |
| 2003/0166314 A1 | * | 9/2003 | Ono et al. .................. | 438/125 |

FOREIGN PATENT DOCUMENTS

| | | |
|---|---|---|
| JP | 11-102944 | 4/1999 |
| JP | 2001-127195 | 5/2001 |
| JP | 2001-127196 | 5/2001 |

* cited by examiner

*Primary Examiner*—Alonzo Chambliss
*Assistant Examiner*—Thanh Y. Tran
(74) *Attorney, Agent, or Firm*—Mattingly, Stanger & Malur, P.C.

(57) ABSTRACT

In order to manufacture a thin and small semiconductor device at low cost, the semiconductor device and its manufacturing method are disclosed. The semiconductor device comprises: a film wiring substrate made of insulating resin; a semiconductor chip fixed to the main surface of the wiring substrate; conductive wires to connect terminals of the semiconductor chip and wirings on the main surface of the wiring substrate; an encapsulation made of insulating resin integrally laminated on the main surface of the wiring substrate and covering the semiconductor chip and the bonding wires; and conductors penetrating through the wiring substrate and having one ends connected to the wirings on the main surface of the wiring substrate and the other ends protruding to the rear surface of the wiring substrate to form external terminals formed of bump electrodes, wherein the external terminals form the ball grid array. The thickness of the semiconductor chip (100 μm or smaller) is larger than that of the wiring substrate (70 μm or smaller), and the thickness of the wiring substrate is larger than the external terminal (30 μm or smaller). The thickness of the semiconductor device is 0.5 mm or smaller.

11 Claims, 19 Drawing Sheets

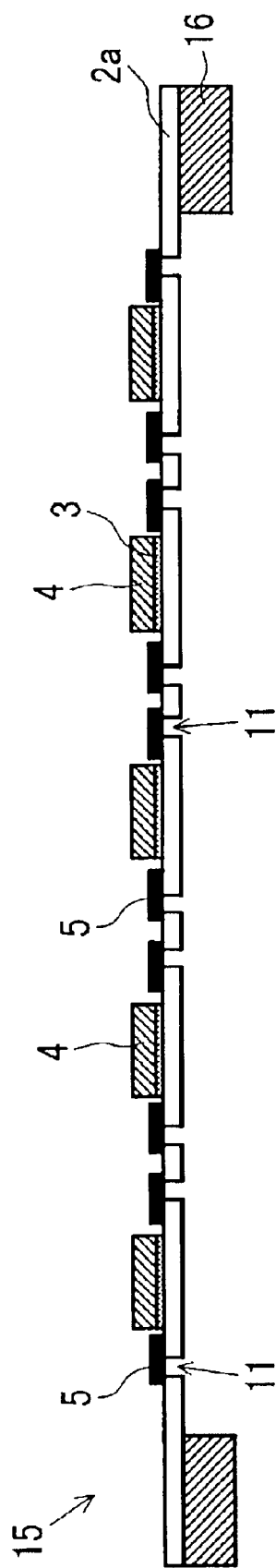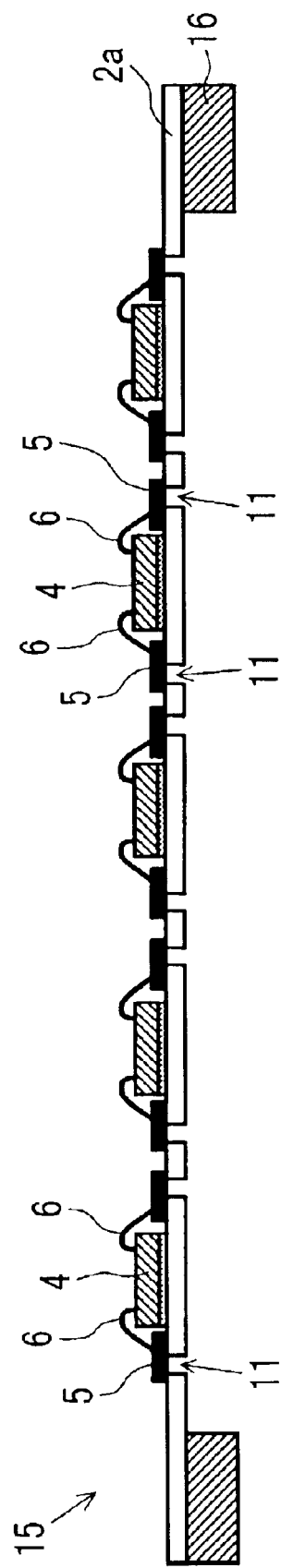

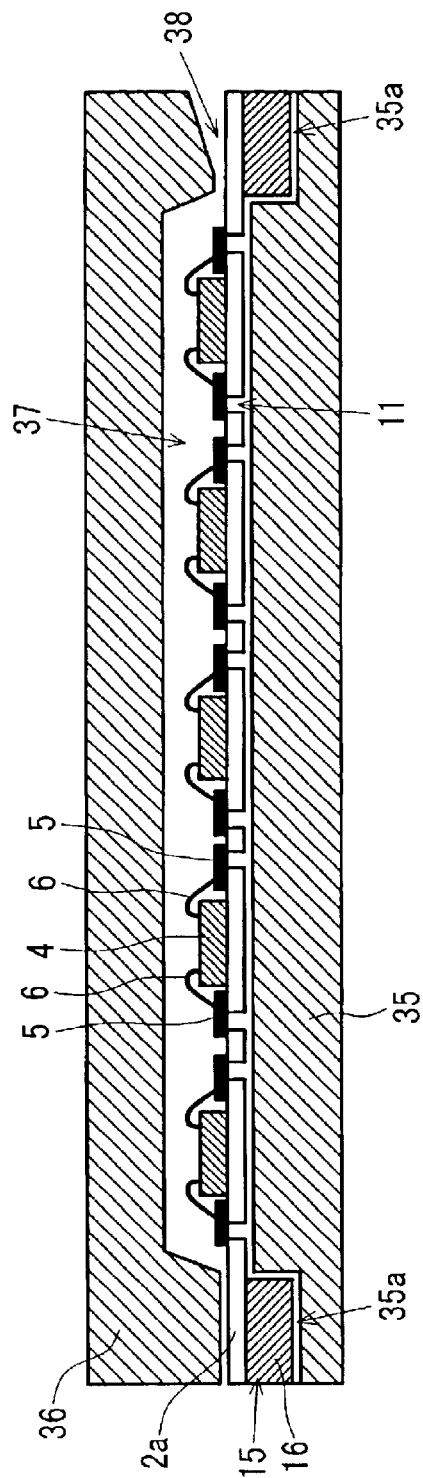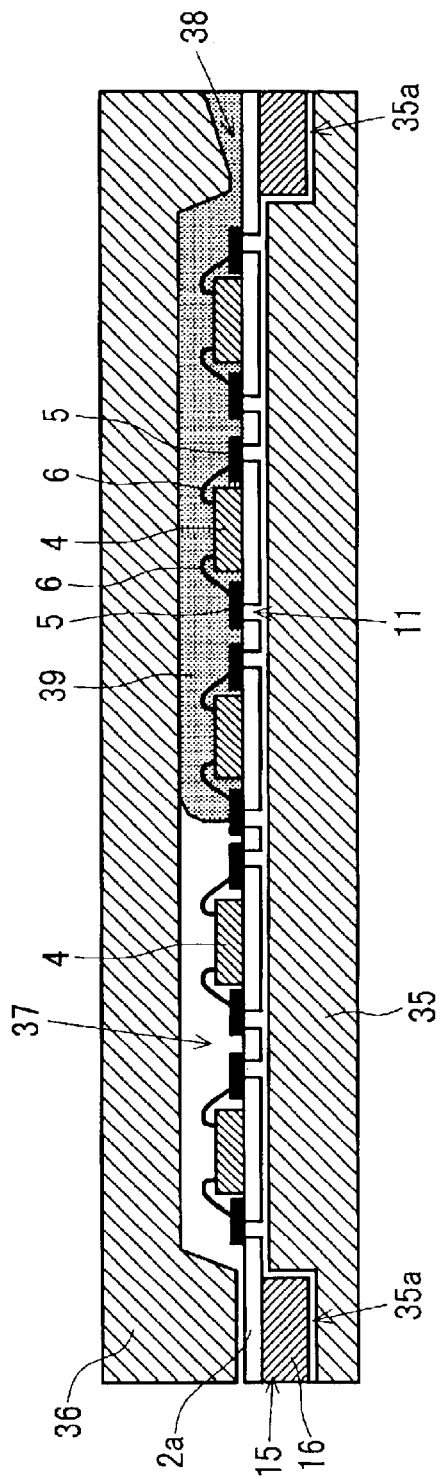

SEMICONDUCTOR DEVICE AND ITS MANUFACTURING METHOD

TECHNICAL FIELD OF THE INVENTION

The present invention relates to a semiconductor device and its manufacturing method. More particularly, the present invention relates to a technique effectively applied to a manufacturing method of a so-called CSP (Chip Scale Package) type semiconductor device, in which a size of an encapsulation is close to that of a semiconductor device chip.

BACKGROUND OF THE INVENTION

With the increasing demand for the size and thickness reduction of the semiconductor device (semiconductor integrated circuit device), a wiring film substrate such as a film made of an insulating resin layer has been used. The use of such a film substrate makes it possible to achieve the reduction in thickness of the semiconductor device.

A manufacturing method of the CSP type semiconductor device having solder bumps in which a wiring film substrate (wiring film) is used is disclosed in the gazette of Japanese Patent Application Laid-Open No. 11-102944.

In this document, the manufacturing method of a semiconductor device is described, which comprises the steps of: (1) temporarily fixing a wiring film on a support plate having an attachable/detachable punching return portion; (2) fixing a semiconductor chip, connecting bonding wires, and forming a resin encapsulation layer; (3) removing the punching return portion and forming solder bumps in a lattice pattern on a rear surface of the wiring film; and (4) dividing the wiring film by cutting the connection portions at the four corners of the cutting lines previously provided along the edges of the resin encapsulation layer. In this manufacturing method of a semiconductor device, the edges of the wiring film are protruded from the outer rim of the resin encapsulation layer serving as an encapsulation.

SUMMARY OF THE INVENTION

For the achievement of the reduction in thickness of the semiconductor device, the inventors of the present invention had been considering a semiconductor device with a thickness of about 0.5 mm or smaller in which a semiconductor chip with a thickness of about 100 μm or smaller is incorporated. Then, the inventors of the present invention considered the manufacturing method of a semiconductor device, using a film strip (film wiring strip) and capable of manufacturing a large number of semiconductor devices at once.

However, since the film substrate does not have sufficient rigidity, it is difficult to transfer it on the production line. Thus, the present invention has been made through the consideration of the application of the block molding method in which the film substrate is supported by a support frame to improve the workability and a large number of devices can be manufactured at once.

An object of the present invention is to provide a technique for manufacturing a thin semiconductor device.

Another object of the present invention is to provide a manufacturing method of a thin semiconductor device capable of reducing the manufacturing cost.

Another object of the present invention is to provide a technique capable of manufacturing a thin and small semiconductor device at low cost.

The above and other objects and novel characteristics of the present invention will be apparent from the description and the accompanying drawings of this specification.

The typical ones of the inventions disclosed in this application will be briefly described as follows.

(1) An aspect of the present invention is a semiconductor device, which comprises:

a wiring substrate with a main surface, a rear surface opposite to the main surface, and side surfaces between the main surface and the rear surface;

a semiconductor chip fixed to the main surface of the wiring substrate;

connecting means for electrically connecting terminals of the semiconductor chip to wirings on the main surface of the wiring substrate;

an encapsulation made of insulating resin which covers the semiconductor chip and the connecting means; and conductors penetrating through the wiring substrate and having one ends connected to the wirings on the main surface of the wiring substrate and the other ends protruding to the rear surface of the wiring substrate to form external terminals, wherein the semiconductor chip is thicker than the wiring substrate, and the wiring substrate is thicker than the external terminal.

(2) Another aspect of the present invention is a method of manufacturing a semiconductor device, which comprises the steps of:

preparing a wiring mother strip having a peripheral portion supported on a support frame and semiconductor device forming areas arranged and formed vertically and horizontally on the main surface thereof;

fixing a semiconductor chip to each of the semiconductor device forming areas of the wiring mother strip;

connecting the terminals of the semiconductor chip to the wirings on the main surface of the wiring mother strip via connecting means;

forming an insulating resin layer on the main surface of the wiring mother strip so as to cover the semiconductor chips and the connecting means;

fixing the wiring mother strip to a support portion so that the rear surface of the wiring mother strip opposite to the main surface faces upward;

cutting the wiring mother strip and the insulating resin layer along the boundaries between the semiconductor device forming areas by a blade; and separating each of the semiconductor devices from the support portion.

(3) Another aspect of the present invention is a method of manufacturing a semiconductor device, which comprises the steps of:

preparing a semiconductor wafer having semiconductor chip areas arranged and formed vertically and horizontally on the main surface thereof;

preparing a wiring mother strip having a peripheral portion supported on a support frame and semiconductor device forming areas arranged and formed vertically and horizontally on the main surface thereof;

forming a plurality of semiconductor chips by cutting the semiconductor wafer vertically and horizontally;

fixing the semiconductor chip to each of the semiconductor device forming areas of the wiring mother strip;

connecting the terminals of the semiconductor chip to the wirings on the main surface of the wiring mother strip via connecting means;

forming an insulating resin layer on the main surface of the wiring mother strip so as to cover the semiconductor chips and the connecting means;

fixing the wiring mother strip to a support portion so that the rear surface of the wiring mother strip opposite to the main surface faces upward;

cutting the wiring mother strip and the insulating resin layer along the boundaries between the semiconductor device forming areas by a blade; and separating each of the semiconductor devices from the support portion.

(4) According to the above (3), the step of forming a plurality of semiconductor chips by cutting the semiconductor wafer vertically and horizontally includes the steps of: forming adhesive on the rear surface of the semiconductor chip and then adhering the side of the semiconductor wafer with adhesive to a dicing tape; and cutting the semiconductor wafer along the boundaries between the semiconductor chip areas on the semiconductor wafer by a dicing blade.

(5) According to the above (3), the step of fixing the semiconductor chip to each of the semiconductor device forming areas of the wiring mother strip includes the steps of: picking up the plurality of semiconductor chips in (4) adhered on the dicing tape one by one from the dicing tape, with the adhesive being applied on the rear surface of the semiconductor chip; and fixing the picked-up semiconductor chips to the semiconductor device forming areas of the wiring mother strip via the adhesive on the rear surface thereof.

In the semiconductor device, the thickness of the wiring mother strip is about 70 $\mu$m or smaller, the thickness of the semiconductor wafer is about 100 $\mu$m or smaller, the thickness of the external terminal is about 30 $\mu$m or smaller, and the thickness of a part of the insulating resin layer on the wiring mother strip is about 400 $\mu$m or smaller. Therefore, the thickness of the semiconductor device is about 0.5 mm or smaller.

According to the semiconductor device and its manufacturing method, semiconductor chips with a thickness of about 100 $\mu$m or smaller are fixed to the main surface of the thin film like wiring mother strip with a thickness of about 70 $\mu$m or smaller, the wire bonding therebetween is performed, the semiconductor chips and the bonding wires are covered with an insulating resin layer, bump electrodes with a thickness of about 30 $\mu$m are formed on the rear surface of the film like wiring mother strip, and then, the film like wiring mother strip and the insulating resin layer are cut lengthwise and crosswise. In this manner, the thin semiconductor devices with a thickness of about 0.5 mm or smaller can be manufactured.

In addition, since the film like wiring mother strip is cut together with the insulating resin layer after the formation of the insulating resin layer, it is possible to manufacture a large number of semiconductor devices at once and consequently to reduce the manufacturing cost of the semiconductor device.

Furthermore, since the semiconductor devices are manufactured by cutting the film like wiring mother strip together with the insulating resin layer lengthwise and crosswise, the side surfaces of the encapsulation in the manufactured semiconductor device formed by cutting the insulating resin layer are vertical to the film like wiring mother strip, and also, it is unnecessary to form slant faces in consideration of the separation of the encapsulations from the mold die. As a result, it is possible to reduce the size of the semiconductor device.

BRIEF DESCRIPTIONS OF THE DRAWINGS

FIG. 8 is a schematic sectional view showing the state where the semiconductor chips are mounted on the film like wiring mother strip in the manufacturing method of the semiconductor device according to the first embodiment;

FIG. 9 is a schematic sectional view showing the state where terminals of the semiconductor chips are connected to the wirings of the film like wiring mother strip by bonding wires in the manufacturing method of the semiconductor device according to the first embodiment;

FIG. 10A is a schematic sectional view of the film like wiring mother strip with support frame showing the state where an insulating resin layer is formed by using a mold die in the manufacturing method of the semiconductor device according to the first embodiment;

FIG. 10B is a schematic sectional view of the film like wiring mother strip with support frame showing the state where an insulating resin layer is formed by using a mold die in the manufacturing method of the semiconductor device according to the first embodiment;

DESCRIPTION OF THE PREFERRED EMBODIMENTS

Hereinafter, embodiments of the present invention will be described in detail with reference to the accompanying drawings. Note that components having the same function are denoted by the same reference symbols throughout the drawings for describing the embodiment, and the repetitive description thereof is omitted.

First Embodiment

Figure 1:
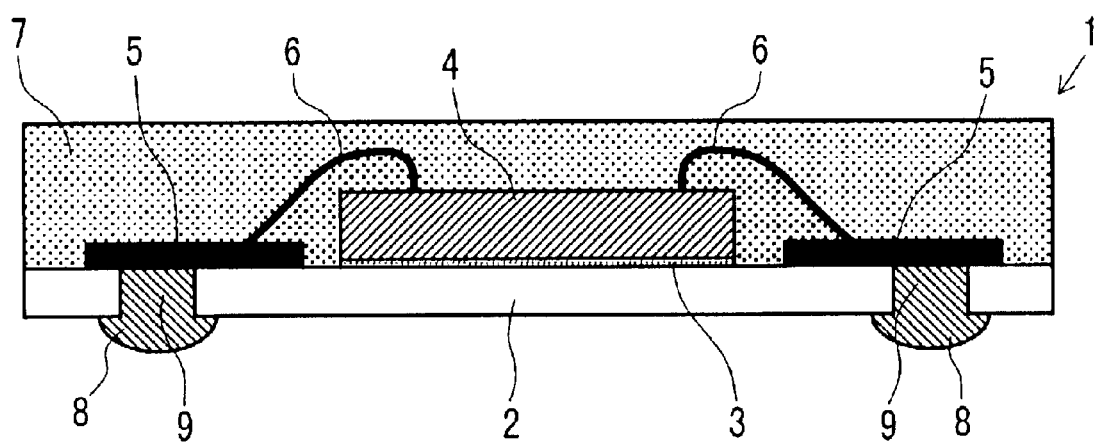
FIG. 1 is a schematic sectional view of a semiconductor device according to an embodiment (first embodiment) of the present invention.
Figure 15:
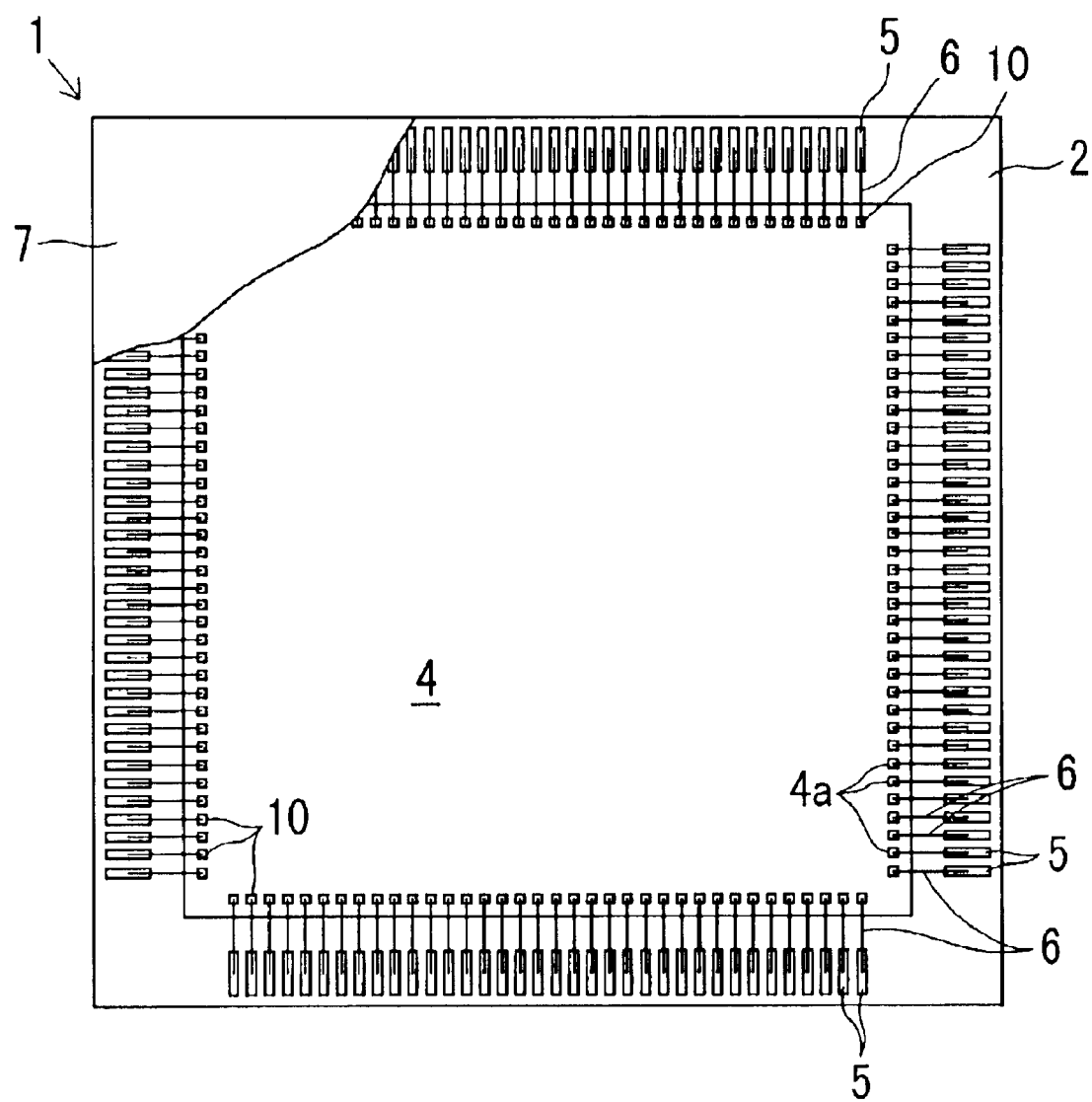
FIG. 15 is a plan view in which a part of the semiconductor device actually manufactured by the manufacturing method of the semiconductor device according to the first embodiment is removed.
Figure 16:
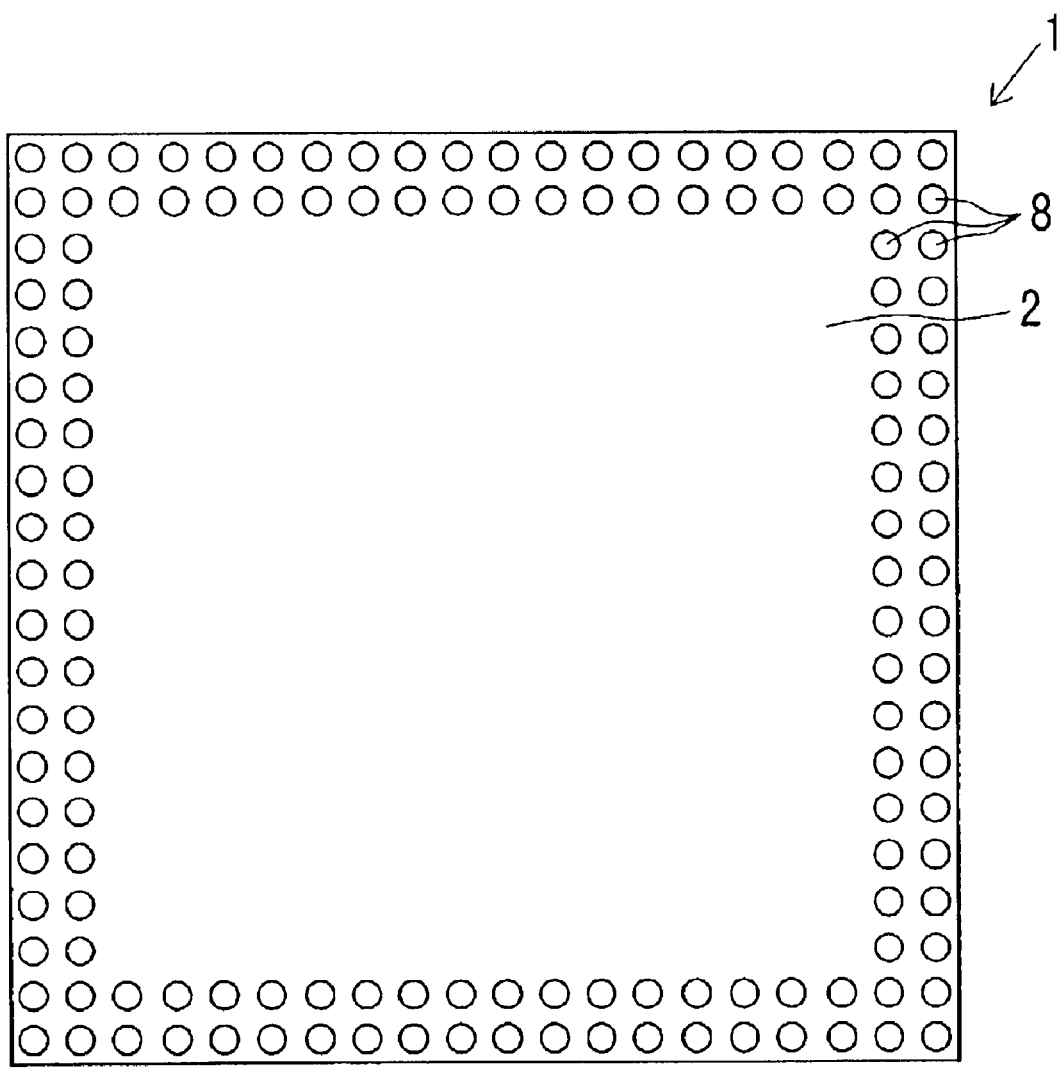
FIG. 16 is a bottom plan view of the actually manufactured semiconductor device by the manufacturing method of the semiconductor device according to the first embodiment.

FIGS. 1 to 16 are drawings relevant to the manufacturing method of a semiconductor device according to an embodiment (first embodiment) of the present invention. FIG. 1 is an enlarged sectional view schematically showing a semiconductor device according to the first embodiment, FIGS. 2 to 14 are drawings relevant to the manufacturing method of the semiconductor device according to the first embodiment, and FIGS. 15 and 16 are drawings showing the semiconductor device actually manufactured.

As shown in FIG. 1, the semiconductor device 1 according to the first embodiment includes a wiring substrate 2; a semiconductor chip 4 fixed on a main surface (upper surface in FIG. 1) of the wiring substrate 2 via adhesive 3; conductive bonding wires 6 to connect terminals (not shown) on a surface of the semiconductor chip 4 and wirings 5 formed on the main surface of the wiring substrate 2; an encapsulation 7 made of insulating resin provided on the main surface of the wiring substrate 2 so as to cover the semiconductor chip 4, the bonding wires 6, and the like; and conductors 9 penetrating through the wiring substrate 2 and each having one end connected to the wiring 5 on the main surface of the wiring substrate 2 and the other end protruding to the rear surface of the wiring substrate to form an external terminal.

The conductor 9 is made of solder including PbSn, and the external terminal 8 is formed as a bump electrode (convex electrode). Also, the adhesive 3 is adhesive film, and the adhesion surfaces on both surfaces thereof are adhered to the wiring substrate 2 and the semiconductor chip 4.

The wiring substrate 2 is formed of a film wiring substrate made of insulating resin. For example, the film wiring substrate is a wiring substrate made of an organic substrate such as a glass-epoxy resin substrate, in which copper foil adhered on a main surface is patterned by etching, a nickel plating layer and gold plating layer are sequentially laminated on a surface, and the bonding wires 6 made of gold can be connected by ultrasonic thermo-compression method.

Also, through holes are provided in the predetermined positions of the glass-epoxy resin substrate before adhering the copper foil to the glass-epoxy resin substrate, and the wirings 5 are formed in the areas including the through holes on the main surface of the film wiring substrate. More specifically, the predetermined wirings 5 are formed so as to cover the through holes and each of the wirings 5 is located on the bottom surface of the through hole.

As mentioned later, in the later process of the manufacture of the semiconductor device, the conductor 9 is printed in a predetermined pattern on the rear surface of the film wiring substrate (wiring substrate 2). The through holes are filled by this printing. Also, after the printing, the conductors 9 are baked and cured. Subsequently, the conductor portions protruded from the rear surface of the film wiring substrate are formed into a hemispherical shape by means of the reheat (reflow), thereby forming the external terminals 8 comprised of bump electrodes (convex electrodes).

In addition, since the semiconductor device 1 is formed by cutting the wiring mother strip and the insulating resin layer formed on the main surface of the wiring mother strip vertically and horizontally with a dicing blade, the shape of the semiconductor device is a square shape. Also, the side surfaces of the wiring substrate 2 and the encapsulation 7 along each side of the square shape are formed flat, and the side surface of the wiring substrate 2 and that of the encapsulation 7 corresponding thereto is located on the same plane.

The thickness of the wiring substrate 2 is 70 μm or smaller, the thickness of the semiconductor chip 4 is 100 μm or smaller, the thickness of the encapsulation 7 is 400 μm or smaller, and the thickness of the external terminal 8 is 30 μm or smaller. Therefore, the thin semiconductor device 1 with a thickness of 0.5 mm or smaller can be realized.

In the semiconductor device 1 according to the first embodiment, the thickness of the semiconductor chip 4 (100 μm or smaller) is larger than that of the wiring substrate 2 (70 μm or smaller), the thickness of the wiring substrate 2 (70 μm or smaller) is larger than that of the external terminal 8 being a bump electrode (30 μm or smaller), and the thickness of the encapsulation portion placed on the semiconductor chip 4 (200 μm or smaller) is larger than that of the semiconductor chip 4 (100 μm or smaller). Due to the dimensional relationship mentioned above, the effective reduction of the thickness of the semiconductor device can be achieved.

Also, FIGS. 15 and 16 are drawings showing the semiconductor device 1 actually manufactured. In the semiconductor device 1 like this, the pitch between terminals 10 arranged in the semiconductor chip 4 is larger than the thickness of the wiring substrate 2 (70 μm or smaller) and is set to be about 80 to 100 μm. Also, as shown in FIG. 16, the external terminals 8 are arranged in an array. The semiconductor device 1 shown in FIGS. 15 and 16 employs a ball grid array in which external terminals 8 are arranged in two lines along each side of the square.

Note that, when forming the land grid array in which the external terminals are extended on the rear surface of the wiring substrate, the printing mentioned above is formed in line with the formation of the land grid array, and the printing is baked and cured. In this case, the reflow process like that in the formation of the ball grid array is unnecessary.

Figure 2:
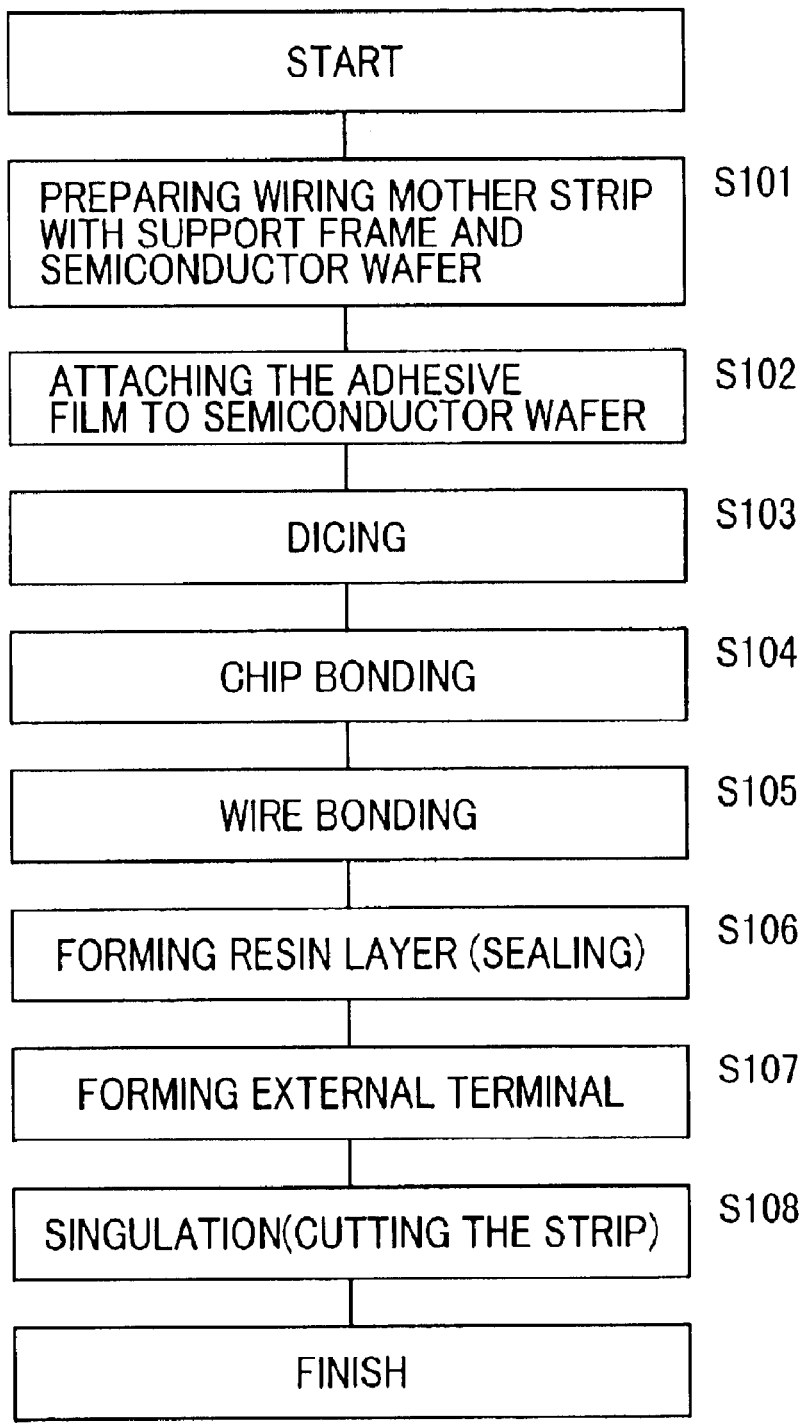
FIG. 2 is a flow chart showing a manufacturing method of the semiconductor device according to the first embodiment.

The semiconductor device 1 as mentioned above is manufactured through the manufacturing process as shown in the flow chart in FIG. 2, that is, preparing a wiring mother strip with support frame and a semiconductor wafer (S101), attaching the adhesive film to the semiconductor wafer (S102), dicing into semiconductor chips (S103), chip bonding (S104), wire bonding (S105), forming a resin layer (sealing) (S106), forming external terminals (S107), and singulation (cutting the strip) (S108).

Next, the manufacturing method of the semiconductor device will be described along the above-mentioned manufacturing process. First, a wiring mother strip with support frame (film like wiring mother strip with support frame) and a semiconductor wafer are prepared (S101).

Figure 3:
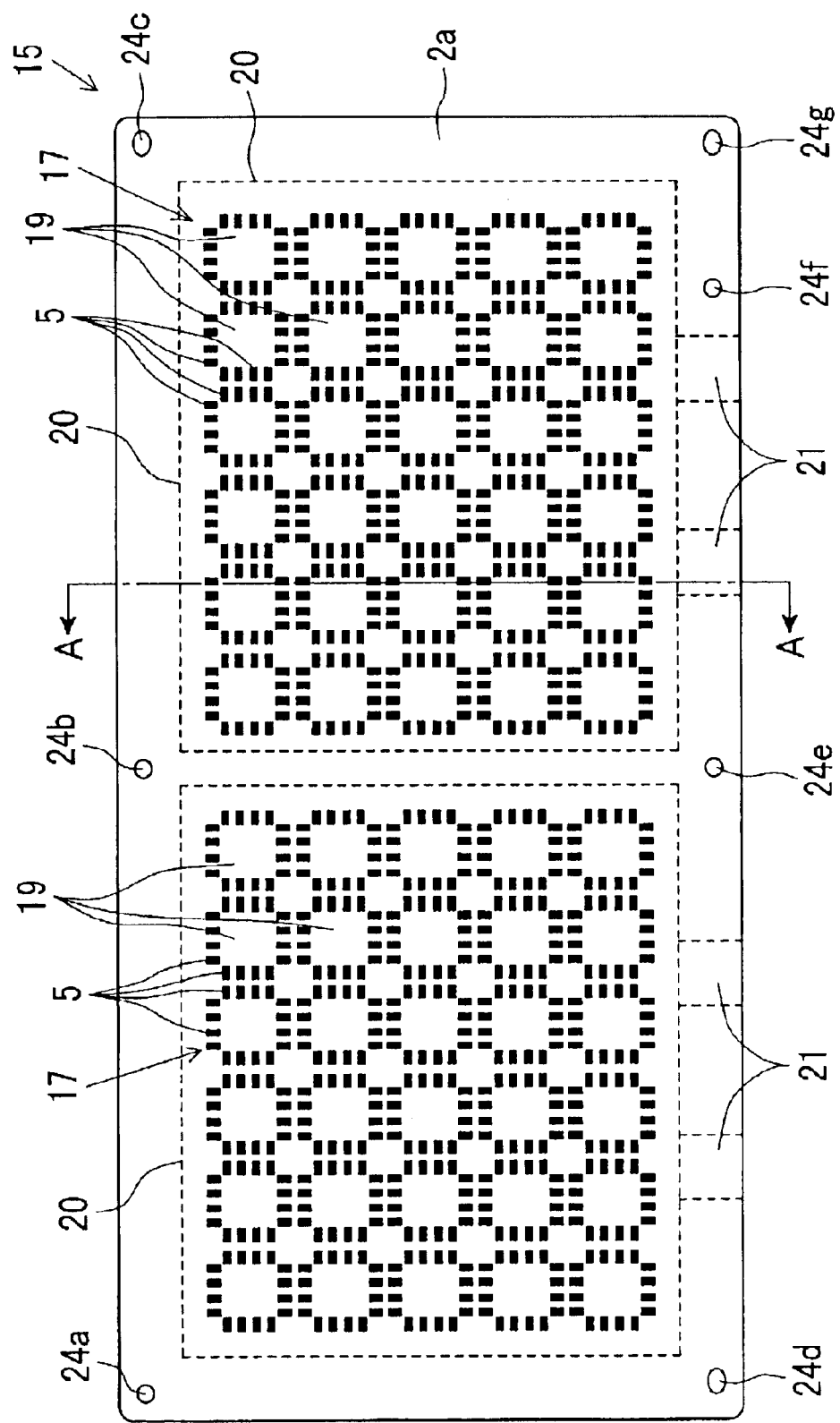
FIG. 3 is a schematic plan view of a film like wiring mother strip with support frame used in the manufacturing method of the semiconductor device according to the first embodiment.
Figure 4:
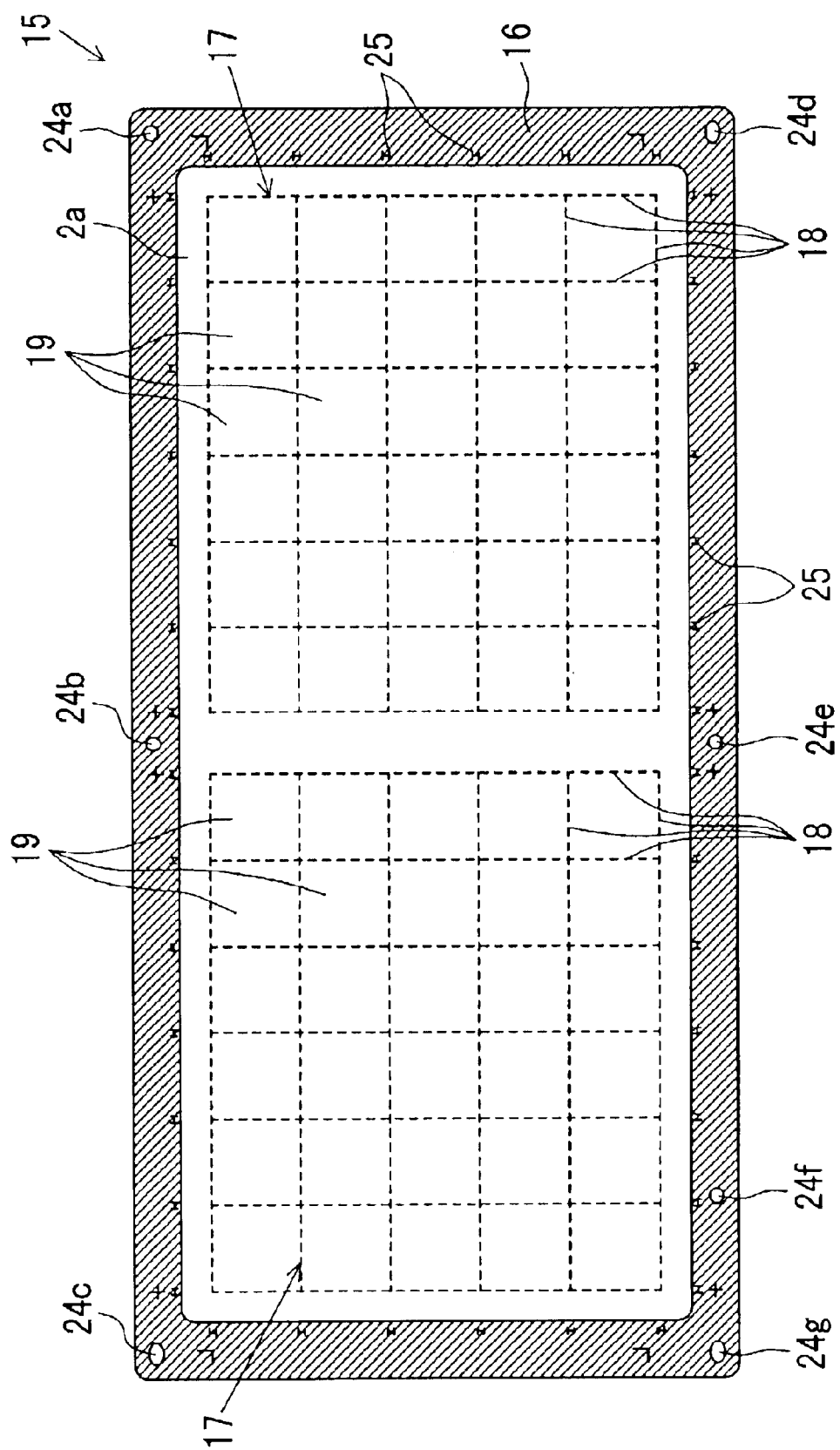
FIG. 4 is a schematic bottom plan view of the film like wiring mother strip with support frame used in the manufacturing method of the semiconductor device according to the first embodiment.
Figure 5:
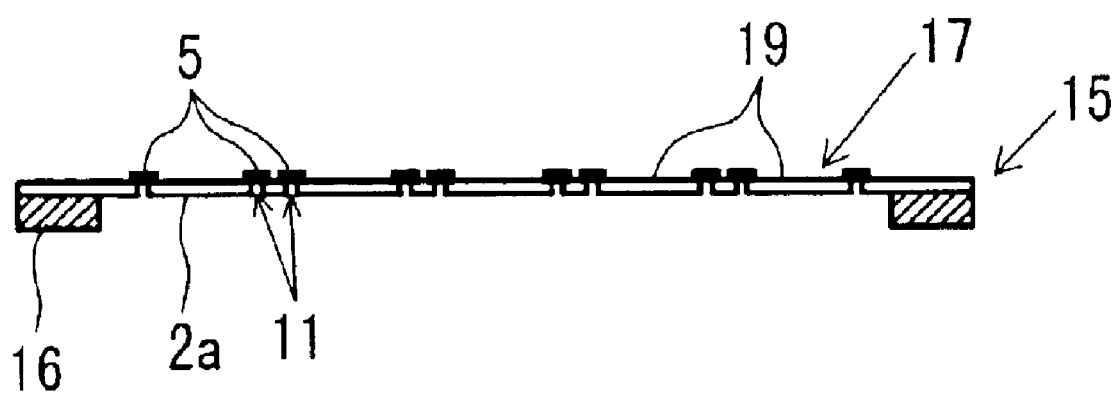
FIG. 5 is a schematic sectional view taken along the line A—A in FIG. 3.

The wiring mother strip with support frame (film like wiring mother strip with support frame) has a structure as shown in FIGS. 3 to 5. FIG. 3 is a schematic plan view of the wiring mother strip with support frame, FIG. 4 is a schematic bottom plan view of the same, and FIG. 5 is a sectional view taken along the line A—A in FIG. 3.

As shown in FIGS. 3 to 5, the wiring mother strip with support frame (film like wiring mother strip with support frame) 15 includes a wiring mother stripe (film like wiring mother stripe) 2a with a thickness of about 70 μm in a rectangular shape and a support frame 16 comprised of a rectangular frame formed of a metal plate (for example, stainless plate) with a thickness of about 150 μm, which supports the outer peripheral portion of the wiring mother strip 2a. The film like wiring mother strip 2a is adhered and fixed to the support frame 16, and the film like wiring mother strip 2a is tightly attached to the support frame 16.

As shown in FIGS. 3 and 4, the film like wiring mother strip 2a has a structure in which two groups of semiconductor device forming areas 17 in a square shape are provided along the longitudinal direction inside the support frame 16. The group of the semiconductor device forming areas 17 is cut along the group of dicing areas 18 extending in a lattice pattern as shown by the dotted lines in FIG. 4 and each product (semiconductor device 1) is obtained. Therefore, the square area to be the semiconductor device 1 is called as a semiconductor device forming area 19. More specifically, the semiconductor device forming areas 19 are arranged vertically and horizontally on the main surface of the film like wiring mother strip 2a.

Since the semiconductor chip is fixed at each center portion of the semiconductor device forming areas 19 on the main surface of the film like wiring mother strip 2a, the film like wiring mother strip 2a has the wiring pattern that the wirings 5 are arranged around each semiconductor device forming area 19. The film like wiring mother strip 2a is a wiring strip formed of a glass-epoxy resin plate (laminated plate of glass, epoxy, and copper) and has a structure in which the copper foil adhered on the main surface is patterned by etching and the nickel plating layer and gold plating layer are sequentially laminated on the surface, and also, the bonding wires made of gold can be connected by the ultrasonic thermo-compression method.

In addition, as shown in FIG. 5, through holes 11 are formed in the film like wiring mother strip 2a. This through hole 11 is provided before the formation of the wiring 5, and the positions of the through holes 11 are selected so that the wirings 5 are located on the through holes 11 after the formation of the wiring 5. This is to electrically connect the conductors 9 to the wirings 5 when forming the conductors 9 by injecting them into the through holes 11 in the later process. Therefore, the wirings 5 are located at the bottom surfaces of the through holes 11. In FIG. 4, the illustration of the through holes 11 is omitted. The film like wiring mother strip 2a is formed of a laminated plate of glass, epoxy, and copper with a thickness of 70 μm or smaller. More specifically, the glass-epoxy laminated plate has a thickness of 70 μm and a copper foil with a thickness of 18 μm is adhered thereon, and the copper foil is selectively etched to form the above-mentioned wirings 5. The through holes 11 are formed before the adhesion of the copper foil. It is also possible to use other materials to form the film like wiring mother strip 2a. For example, a polyimide film is available. The use of the polyimide film brings such advantage as the further reduction in thickness of the semiconductor device.

The dicing of the group of semiconductor device forming areas 17 is performed as described above. However, in advance of the dicing process, the semiconductor chips mounted on the main surface of the film like wiring mother strip 2a and the bonding wires to connect the semiconductor chip mounted on the main surface of the film like wiring mother strip 2a and the film like wiring mother strip 2a are covered with an insulating resin layer. This insulating resin layer is formed by the transfer mold. In FIG. 3, the frame of the dotted lines enclosing the group of semiconductor device forming areas 17 represents a seal area 20. This seal area 20 is formed so as to be larger than the group of semiconductor device forming areas 17. This is to form separation grooves in the insulating resin layer by cutting the insulating resin layer with the dicing blade. Also, reference numerals 21 denote the positions of the gates through which resin in the transfer mold is injected.

As shown in FIGS. 3 and 4, guide holes 24a to 24g used in the transfer and the positioning of the wiring mother stripe with support frame 15 are provided in the peripheral portion of the wiring mother strip with support frame 15. Also, as shown in FIG. 4, alignment marks 25 serving as the targets of the cutting positions in the dicing are provided on the support frame 16.

Note that the wiring patterns of the semiconductor device forming areas 19 and the positions of the through holes 11 are not limited to those described in this embodiment. Also, in the case where a plurality of semiconductor chips are mounted, the wiring patterns and the arrangement pattern of the through holes are of course changed, and the patterns suitable for the case are used.

Figure 6:
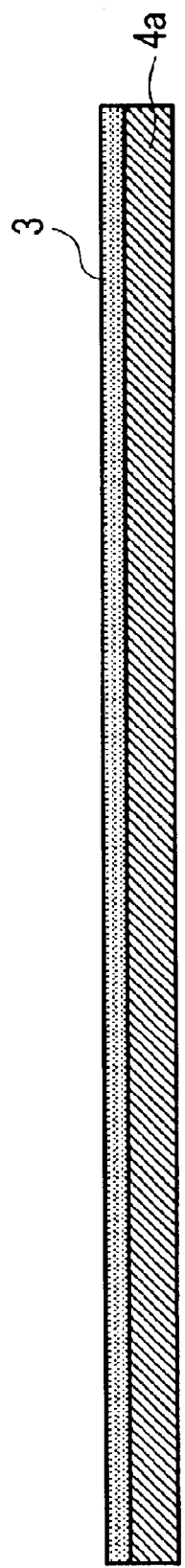
FIG. 6 is a schematic sectional view of a wafer used in the manufacturing method of the semiconductor device according to the first embodiment, to which adhesive sheet is adhered.

Meanwhile, as shown in FIG. 6, the adhesive 3 for the chip bonding is formed on the rear surface (upper surface in FIG. 6) of the semiconductor wafer 4a made of silicon. For example, adhesive film 3 having adhesive faces on both surfaces thereof is adhered as the adhesive 3 (S102). This adhesive film 3 has a thickness of, for example, about 25 μm. Though not shown, the terminals 10 are provided on the main surface (lower surface in FIG. 6) of the wafer 4a.

Though not shown, the wafer 4a has a circular form and a part of the wafer 4a is linearly cut to form an orientation finding face (OFF). Also, the semiconductor chip forming areas are formed vertically and horizontally along the OFF. The semiconductor chip forming areas are the parts to be rectangular semiconductor chips, and predetermined circuit elements are formed therein. The wafer 4a has a thickness of, for example, 750 μm and a diameter of 8 inches. Since the rear surface of the wafer 4a has been grinded (back grind), the thickness of the wafer 4a at the time when adhering to the adhesive film 3 is reduced to 100 μm or smaller.

Figure 7:
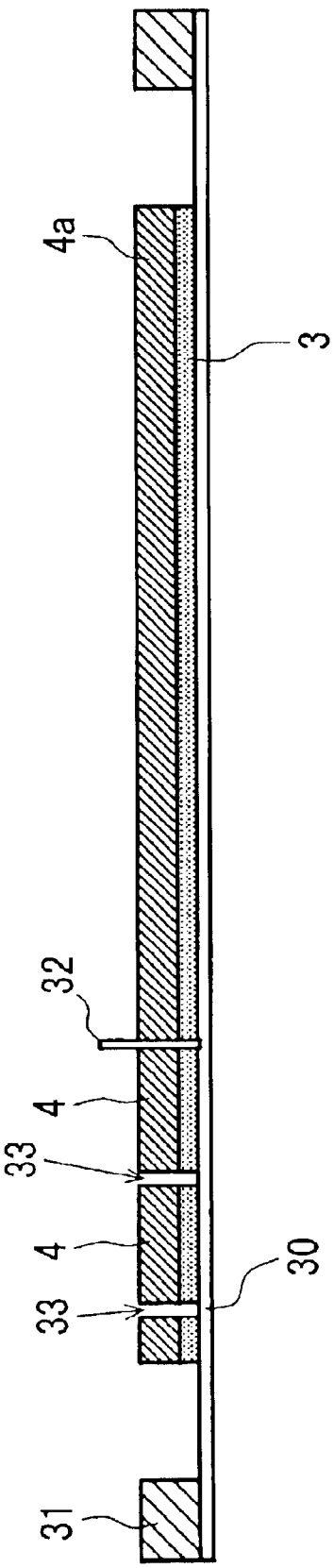
FIG. 7 is a schematic sectional view showing the state where a wafer with the adhesive sheet adhered to dicing tape is diced with using a dicing blade in the manufacturing method of the semiconductor device according to the first embodiment.

Next, the dicing of the wafer 4a into semiconductor chips is performed (S103). In the dicing into semiconductor chips, as shown in FIG. 7, the wafer 4a with the adhesive film 3 is adhered to a dicing tape 30 via the adhesive film 3. The peripheral portion of the dicing tape 30 is adhered to the support frame 31. Thereafter, the wafer 4a are cut vertically and horizontally with the dicing blade 32 as shown in FIG. 7. In this cutting with the dicing blade 32, the wafer 4a are cut along the grooves 33 formed in the boundaries between the semiconductor chip portions arranged vertically and horizontally on the wafer 4a. More specifically, the dicing of the wafer 4a is performed in a lattice pattern. In this case, the cutting in a first direction is sequentially performed and then the cutting in a second direction orthogonal to the first direction is sequentially performed. In this manner, the cutting in the lattice pattern is finished.

In this dicing, the cutting depth reaches the intermediate portion of the dicing tape 30. Therefore, each of the semiconductor chips 4 separated by this cutting is adhered to the dicing tape 30 via the adhesive film 3.

Subsequently, the semiconductor chips 4 on the dicing tape 30 are picked up one by one, and then, the semiconductor chip 4 is conveyed to a semiconductor chip fixing area in each of the semiconductor device forming areas 19 on the film like wiring mother strip 2a (chip bonding: S104).

In this chip bonding (semiconductor chip fixing), though not shown, a collet of vacuum suction type is brought down on a predetermined semiconductor chip 4 from above the dicing tape 30, and the semiconductor chip 4 is located close to the holding surface with a concave face at the bottom of the quadrangular pyramid. Then, a plurality of lifting needles located immediately below the collet are raised and penetrated through the dicing tape 30 to lift up the semiconductor chip 4. Further, the semiconductor chip 4 is held on the convex face at the bottom of the quadrangular pyramid of the collet by the vacuum suction of the collet. After the collet is moved to the position above the film like wiring mother strip 2a and then positioning the collet, the collet is brought down to provide the semiconductor chip 4 in a predetermined position of the semiconductor device forming area 19. Thereafter, the semiconductor chip 4 is fixed to the film like wiring mother strip 2a with the adhesive film 3. FIG. 8 is a sectional view showing the film like wiring mother strip 2a to which the semiconductor chip 4 is fixed.

Next, the terminals of the semiconductor chip 4 (not shown) and the wirings 5 of the film like wiring mother strip 2a are connected by the conductive bonding wires 6 (wire bonding: S105). FIG. 9 is a schematic sectional view showing the state where the wirings 5 of the film like wiring mother strip 2a and the terminals of the semiconductor chip 4 are connected by the bonding wires 6.

Figure 11:
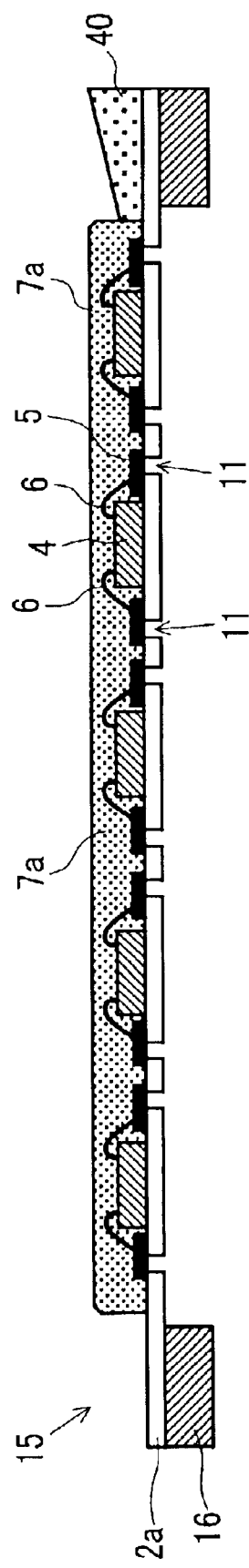
FIG. 11 is a schematic sectional view of the film like wiring mother strip with support frame on which the insulating resin layer is formed in the manufacturing method of the semiconductor device according to the first embodiment.

Next, as shown in FIG. 11, an insulating resin layer 7a is formed on the main surface of the film like wiring mother strip 2a so as to cover the semiconductor chips 4 and the bonding wires 6 (forming resin layer: S106). The insulating resin layer 7a is formed in the two seal areas 20 shown in FIG. 3. The insulating resin layer 7a is formed of the single sided mold based on the transfer molding method. The single sided mold is formed by the use of the mold die of the transfer molding machine, that is, a bottom mold die 35 and a top mold die 36 as shown in FIG. 10. The bottom mold die 35 has recesses 35a in which the support frame 16 is held so that the wire like wiring mother strip 2a is supported on a flat parting surface without warping it.

The single sided mold is formed in the following manner. That is, after the wiring mother strip with support frame 15 on which the chip bonding and the wire bonding are finished is clamped between the bottom mold die 35 and the top mold die 36 as shown in FIG. 10A, the liquid resin 39 (for example, epoxy resin) is pressed through the gate 38 into the cavity 37 formed by the clamped bottom mold die 35 and the top mold die 36 as shown in FIG. 10B. Then, the resin is cured and hardened. The air in the cavity 37 is pushed out by the resin 39 injected into the cavity 37 and discharged to the outside of the cavity 37 through the air vent (not shown). Therefore, it is possible to form the insulating resin layer 7a containing no air bubbles. In this case, the thickness of the insulating resin layer 7a is set to be smaller than 400 µm so that the thickness of the manufactured semiconductor device can be 0.5 mm or smaller. FIG. 11 shows the wiring mother strip with support frame 15 separated from the mold die. FIG. 11 is a diagram showing the state where the resin cured at the position of the gate, that is, gate cured resin 40 remains on the film like wiring mother strip 2a.

Figure 12A:
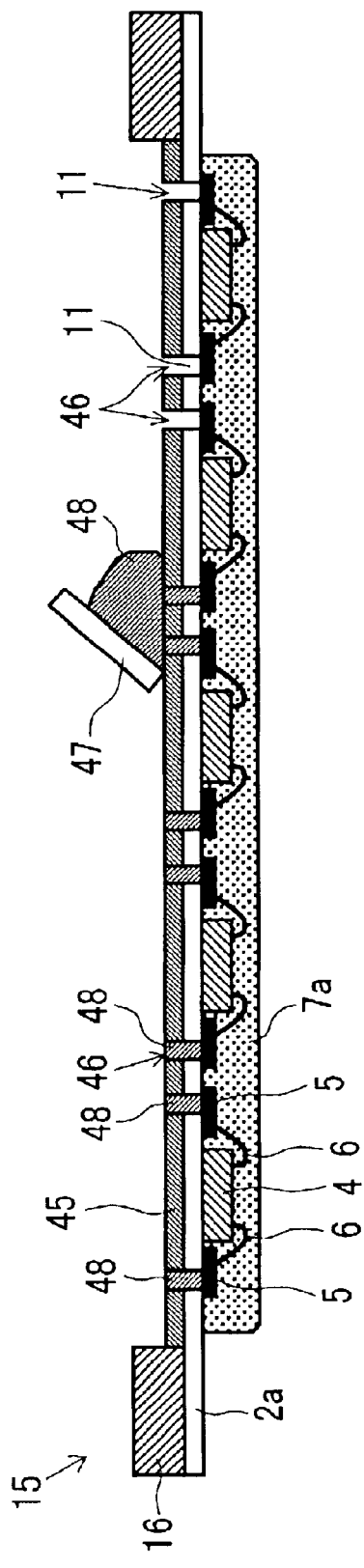
FIG. 12A is a schematic sectional view showing the state where bump electrodes are formed on the rear surface of the film like wiring mother strip in the manufacturing method of the semiconductor device according to the first embodiment.

Next, the external terminals are formed (S107). As shown in FIG. 12A, the rear surface of the film like wiring mother strip 2a is turned upward, and a screen printing mask 45 is placed on the rear surface of the film like wiring mother strip 2a. In the screen printing mask 45, holes 46 are provided at the positions corresponding to the through holes 11 of the film like wiring mother strip 2a. Then, a squeegee 47 is moved so as to rub the upper surface of the screen printing mask 45. Since the squeegee 47 is slanted and is moved while holding solder paste 48 supplied below the slant surface, the solder paste 48 is compressed and printed in the holes 46 of the screen printing mask 45.

Figure 12B:
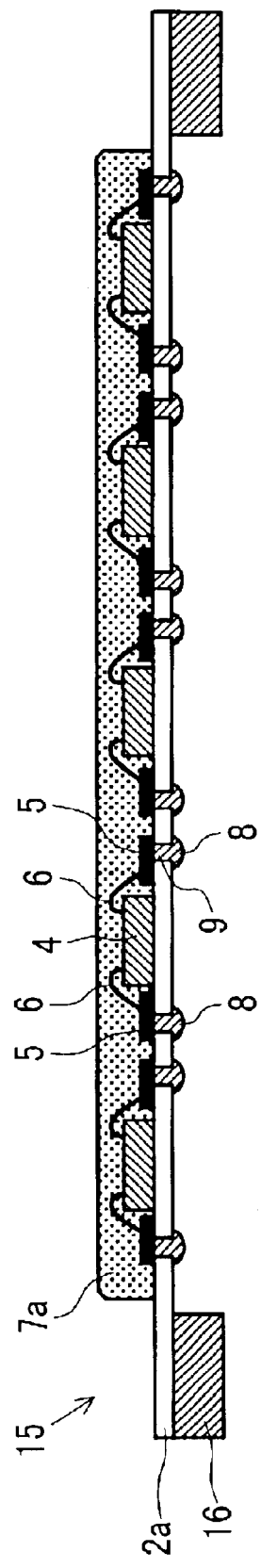
FIG. 12B is a schematic sectional view showing the state where bump electrodes are formed on the rear surface of the film like wiring mother strip in the manufacturing method of the semiconductor device according to the first embodiment.

After the printing, the screen printing mask 45 is removed and the reflow at the predetermined temperature is performed, thereby forming the conductors 9 connected to the wirings 5 in the through holes 11 of the film like wiring mother strip 2a and forming the external terminals 8 formed of bump electrodes (convex electrodes) on the main surface of the film like wiring mother strip 2a as shown in FIG. 12B. More specifically, since the solder paste 48 equivalent to the thickness of the screen printing mask 45 is protruded from the main surface of the film like wiring mother stripe 2a, the protruding conductor portions are formed into the bump electrodes with a hemispherical surface by the reflow. The protrusion length of the bump electrode is set to be 30 µm or smaller by selecting the thickness of the screen printing mask 45 so that the thickness of the manufactured semiconductor device, that is, the thickness from the surface of the bump electrode to the upper surface (front surface) of the encapsulation can be set to be 0.5 mm or smaller.

If the process performed after the printing is only the baking of the solder paste 48 for removing the volatile materials in the paste, that is, if the reflow process is not performed, the external terminal 8 with the predetermined thickness is formed on the rear surface of the film like wiring mother strip 2a. Therefore, it is possible to manufacture the semiconductor device 1 with the external terminals in the land grid array by appropriately selecting the shape of the holes 46 in the screen printing mask 45.

Figure 13:
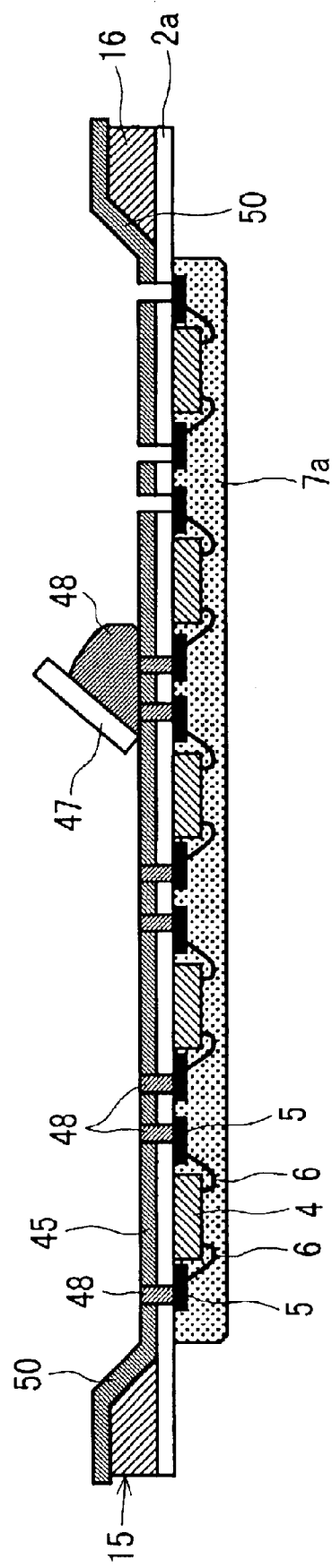
FIG. 13 is a schematic sectional view showing another example of the film like wiring mother strip with support frame used to print the conductive paste to form the bump electrodes.

FIG. 13 is a schematic sectional view showing another example of the film like wiring mother stripe with support frame 15 on which conductive paste (solder paste) for forming the bump electrodes is printed. In this example, the screen printing mask 45 is placed on both the support frame 16 and the film like wiring mother strip 2a, and the inner rim of the support frame 16 is formed into a gently slant portion 50 so that the squeegee 47 can be continuously moved from the support frame 16 to the film like wiring mother strip 2a and from the film like wiring mother strip 2a to the support frame 16.

Figure 14:
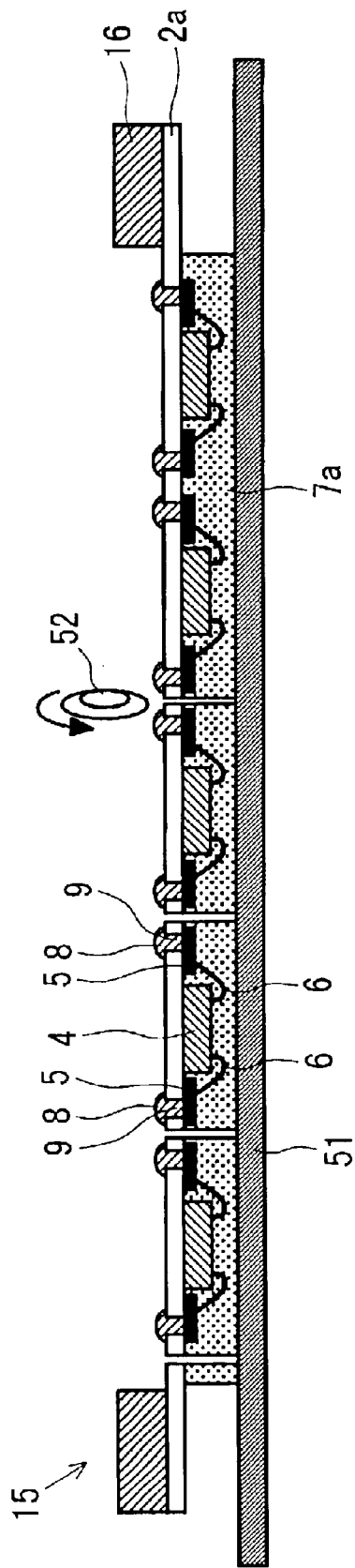
FIG. 14 is a schematic sectional view showing the state where the film like wiring mother strip and the insulating resin layer are cut in the manufacturing method of the semiconductor device according to the first embodiment.

Subsequently, the insulating resin layer 7a of the wiring mother strip with support frame 15 is adhered to a support portion 51 as shown in FIG. 14. The support portion 51 is made of, for example, adhesive film and, though not shown, the outer peripheral portion thereof is supported on the support frame. Then, the film like wiring mother strip 2a and the insulating resin layer 7a are cut along the boundaries between the semiconductor device forming areas by the dicing blade 52 so that the cutting depth reaches the surface or the intermediate part of the support portion 51, thereby singulating the respective semiconductor device forming areas to form the semiconductor devices 1 (S108). The separated semiconductor devices 1 are still adhered to the support portion 51. Then, each of the semiconductor devices 1 is separated from the support portion 51, thereby forming the plurality of semiconductor devices 1 as shown in FIG. 1.

Each of the side surfaces of the wiring substrate 2 and each of the side surfaces of the encapsulation 7 corresponding thereto of the semiconductor device 1 in a square shape are flat surfaces located on the same plane because the film like wiring mother strip 2a and the insulating resin layer 7a are cut together by the use of the dicing blade.

Figure 17:
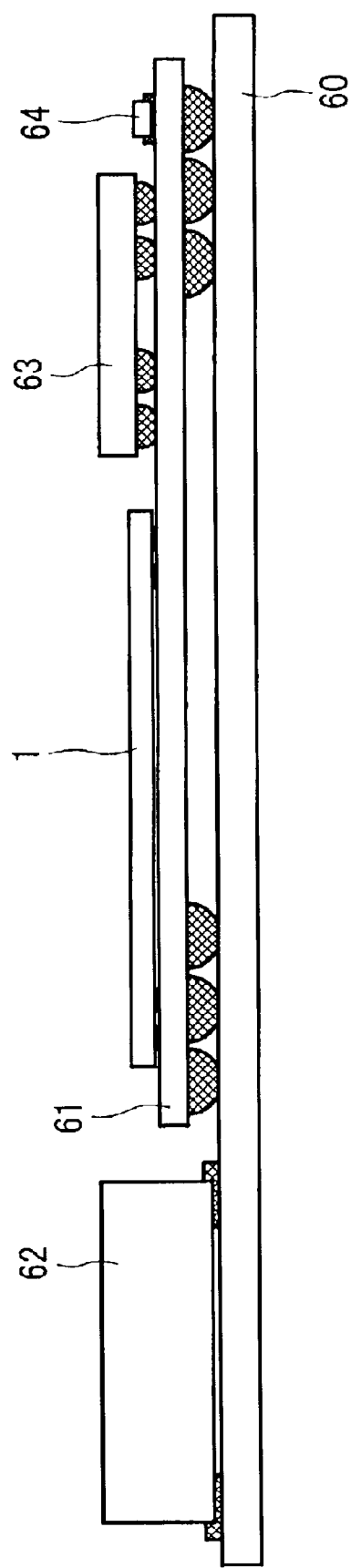
FIG. 17 is a schematic diagram showing a part of an electronic device in which the semiconductor device according to the first embodiment is mounted.

FIG. 17 is a schematic diagram showing a part of an electronic device in which the semiconductor device according to the first embodiment is mounted. A crystal device 62 to which a daughter board 61, a clock generator circuit, and the like are incorporated is mounted on a main surface (upper surface) of a mother board 60. Also, the semiconductor device 1 according to the first embodiment is mounted on the main surface (upper surface) of the daughter board 61. In addition, a wafer level package 63 and a surface mount device (0603 type) 64 are also mounted on the main surface of the daughter board 61. Though the structure of the wafer level package 63 is relatively thin, the semiconductor device 1 according to the first embodiment with the thickness of 0.5 mm or smaller is thinner than it. Therefore, it is possible to reduce the mounting height.

The following advantages can be obtained according to the first embodiment.

(1) The semiconductor chips 4 with a thickness of about 100 μm or smaller are fixed and wire-bonded to the main surface of the thin film like wiring mother stripe 2a with a thickness of about 70 μm or smaller, the semiconductor chips 4 and the bonding wires 6 are covered with the insulating resin layer 7a, external terminals 8 formed of bump electrodes with a thickness of about 30 μm or smaller are formed on the rear surface of the film like wiring mother strip 2a, and the film like wiring mother strip 2a is cut vertically and horizontally together with the insulating resin layer 7a. Therefore, it is possible to manufacture the thin semiconductor device 1 with a thickness of about 0.5 mm or smaller.

(2) According to (1), after the formation of the insulating resin layer 7a, the film like wiring mother strip 2a is cut together with the insulating resin layer 7a. Therefore, it is possible to manufacture a large number of the semiconductor devices 1 at once and consequently to reduce the manufacturing cost of the semiconductor device 1.

(3) According to (1), the semiconductor device 1 is manufactured by cutting the film like wiring mother strip 2a together with the insulating resin layer 7a vertically and horizontally. Therefore, the side surfaces of the encapsulation 7 in the manufactured semiconductor device 1 formed by cutting the insulating resin layer 7a are vertical to the film like wiring mother strip 2a, and also, it is unnecessary to form slant faces in consideration of the separation of the encapsulations 7 from the mold die. As a result, it is possible to reduce the size of the semiconductor device 1.

(4) In the case of using the glass-epoxy resin plate, it is possible to reduce the cost in comparison with the case of using the polyimide film.

Second Embodiment

Figure 18:
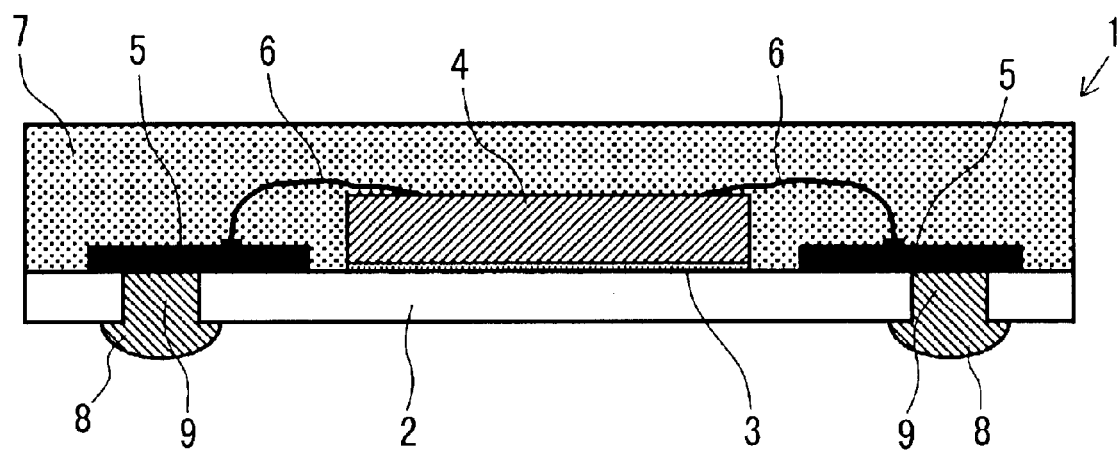
FIG. 18 is a schematic sectional view of a semiconductor device according to another embodiment (second embodiment) of the present invention.

FIG. 18 is a schematic sectional view of a semiconductor device according to another embodiment (second embodiment) of the present invention. The semiconductor device 1 according to the second embodiment is different from that of the first embodiment only in the connection process of the bonding wires 6. More specifically, the bonding wires 6 are first connected to the wirings 5 on the film like wiring mother strip 2a in the first bonding, and then, connected to the terminals on the semiconductor chip 4 in the second bonding. Since the bonding wires 6 are connected by the ultrasonic thermo-compression method, the loop height of the bonding wires extending from the positions of the first bonding is high. However, since the bonding wires are extended in lateral directions in the positions of the second bonding, the loop height of the bonding wires is extremely reduced in the positions of the second bonding. Therefore, the loop height of the bonding wires 6 from the main surface of the semiconductor chip 4 becomes extremely small in such a bonding, that is, the reverse bonding. As a result, the encapsulation efficiency by the encapsulation 7 can be improved.

Also, according to the manufacturing method of a semiconductor device in the second embodiment, since the bonding wires are provided by using the reverse bonding, the loop height of the bonding wires from the main surface of the semiconductor chip 4 becomes small, and the height of the encapsulation 7 can be further reduced. As a result, it is possible to reduce the thickness of the semiconductor device 1.

Third Embodiment

Figure 19:
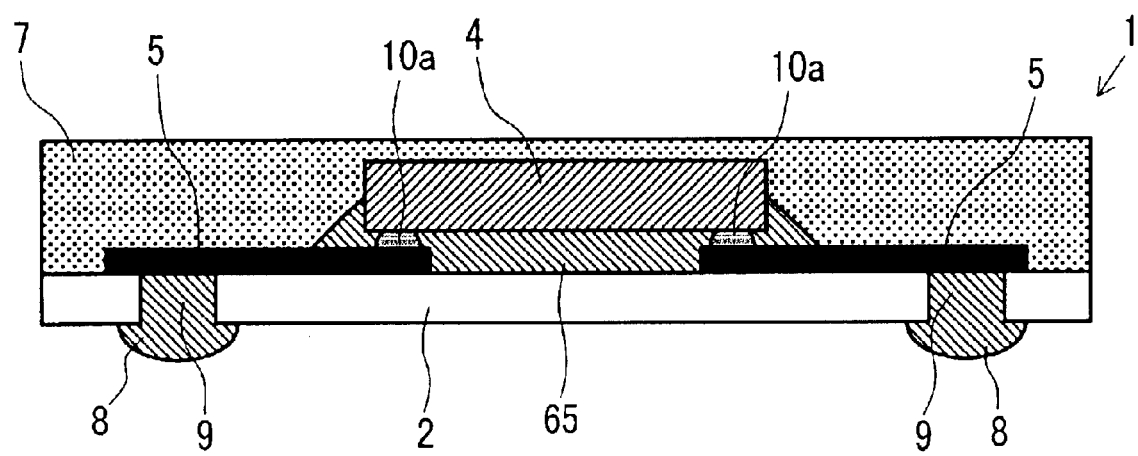
FIG. 19 is a schematic sectional view of a semiconductor device according to still another embodiment (third embodiment) of the present invention.

FIG. 19 is a schematic sectional view showing a semiconductor device according to still another embodiment (third embodiment) of the present invention. The semiconductor device 1 according to the third embodiment is different from that of the first embodiment in that the mounting of the semiconductor chip 4 is performed by the face down bonding.

More specifically, in the process of fixing the semiconductor chip 4 to each semiconductor device forming area 19 of the film like wiring mother strip 2a and connecting the terminals of the semiconductor chip 4 and the wirings 5 on the main surface of the film like wiring mother strip 2a via connecting means (not shown), the semiconductor chips 4 are turned over and the terminals of the semiconductor chip 4 are connected to the wirings 5 on the main surface of the film like wiring mother strip 2a so that the fixing of the semiconductor chips 4 and the connection of the terminals of the semiconductor chip 4 are simultaneously performed.

FIG. 19 shows a semiconductor device 1 manufactured in line with the above-mentioned method, in which the bump electrodes 10a of the semiconductor chip 4 are electrically and mechanically connected to the wirings 5 provided on the main surface of the film wiring substrate 2 via adhesive such as solder, and the connection of the electrodes and the fixing of the semiconductor chip 4 are simultaneously performed. Note that under fill 65 made of insulating resin is injected into the space between the semiconductor chip 4 and the film wiring substrate 2 to improve the moisture resistance.

According to the manufacturing method of a semiconductor device in the third embodiment, since the semiconductor chip 4 is fixed by the face down bonding, the wire bonding process is unnecessary, and thus, it is possible to reduce the manufacturing cost and to reduce the height of the encapsulation 7. As a result, it is possible to reduce the thickness of the semiconductor device 1.

Fourth Embodiment

Figure 20:
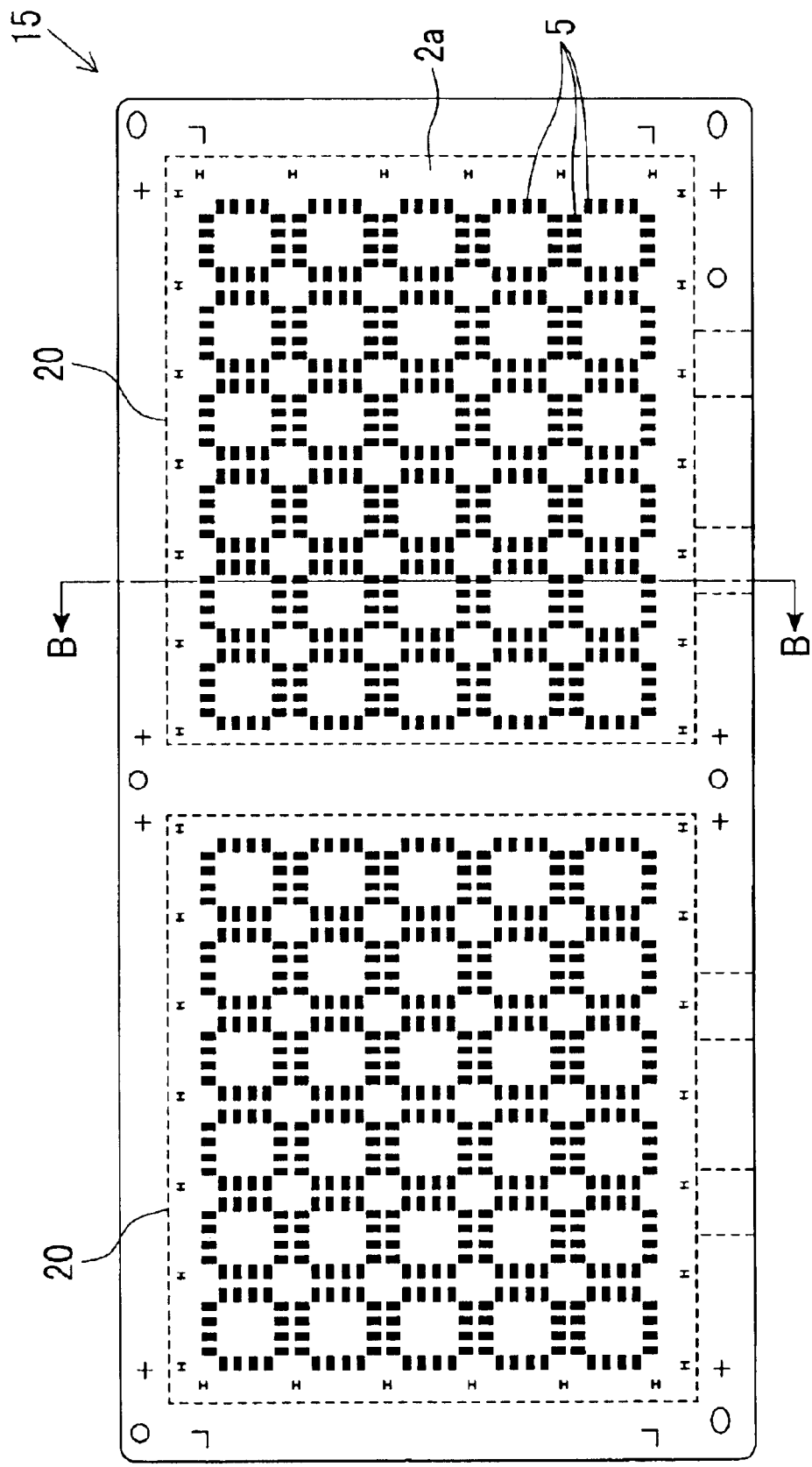
FIG. 20 is a schematic plan view showing the film like wiring mother strip with support frame used in the manufacturing method of a semiconductor device according to still another embodiment (fourth embodiment) of the present invention.
Figure 21:
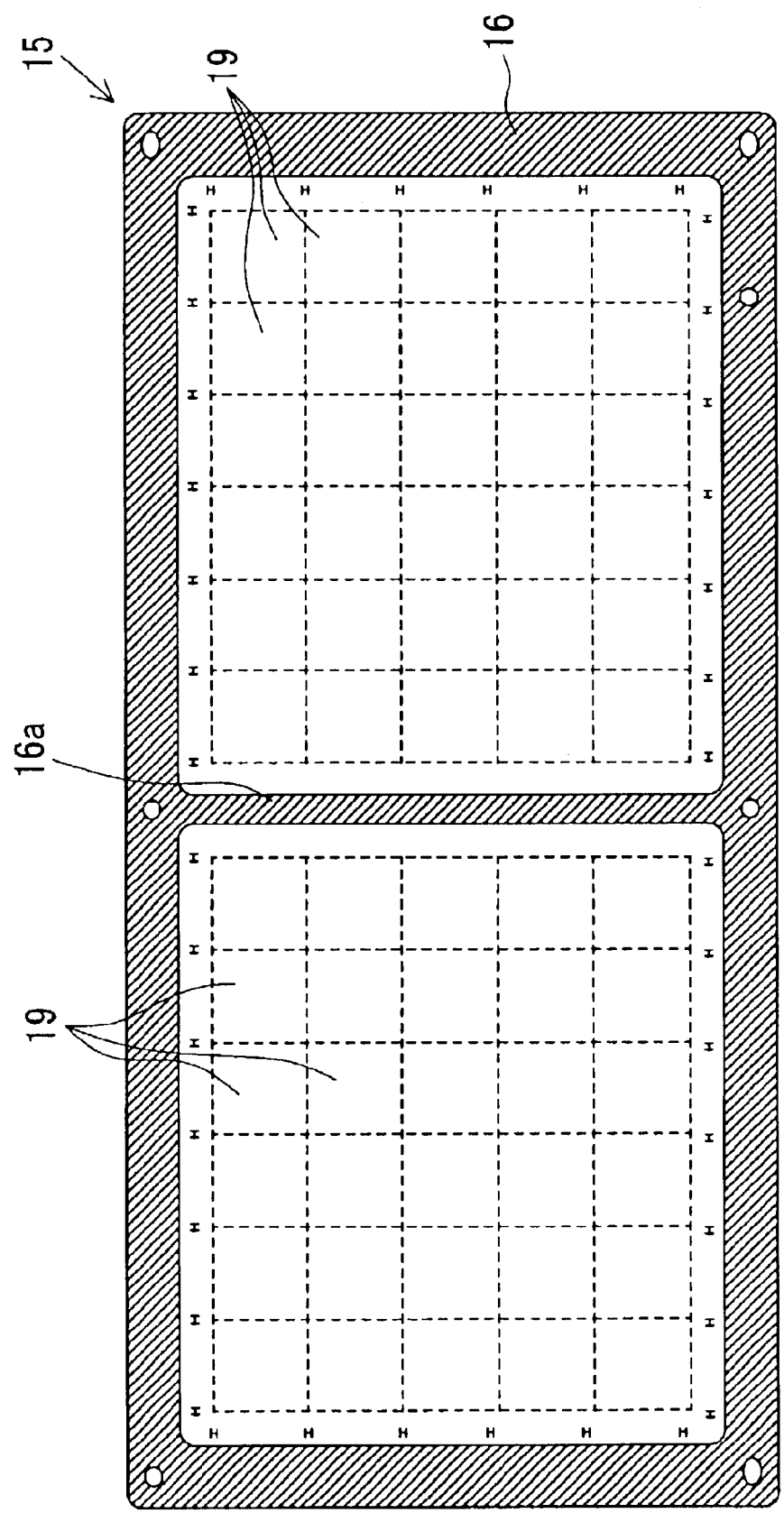
FIG. 21 is a schematic bottom plan view of the film like wiring mother strip with support frame used in the manufacturing method of a semiconductor device according to the fourth embodiment.
Figure 22:
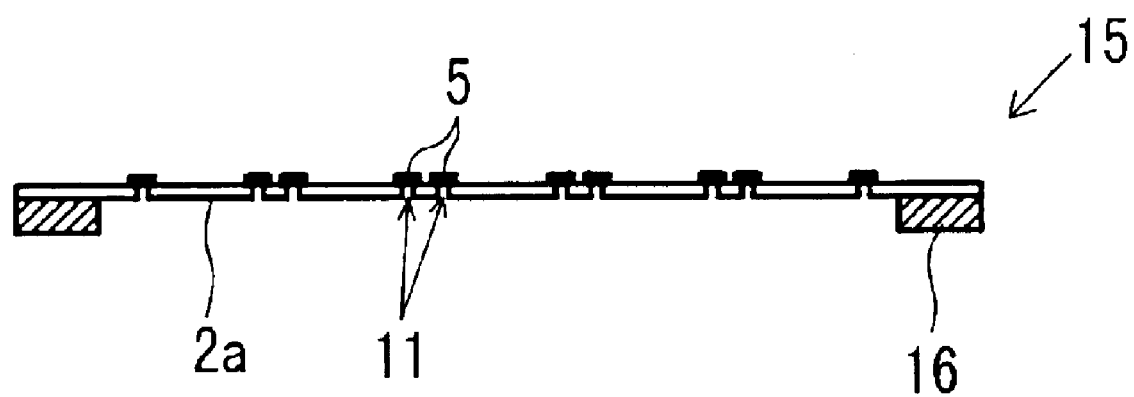
FIG. 22 is a schematic sectional view taken along the line B—B in FIG. 20.

FIGS. 20 to 22 are diagrams relevant to the manufacturing method of a semiconductor device according to still another embodiment (fourth embodiment) of the present invention. FIG. 20 is a schematic plan view of the film like wiring mother strip with support frame, FIG. 21 is a schematic bottom plan view of the film like wiring mother strip with support frame, and FIG. 22 is a schematic sectional view taken along the line B—B in FIG. 20.

In the fourth embodiment, the manufacturing method of the semiconductor device in the first embodiment is partially changed, that is, a support piece 16a is provided at the center of the support frame 16 to which the film like wiring mother strip 2a is adhered as shown in FIG. 21. Similar to the support frame 16, the support piece 16a is made of a metal plate (for example, stainless plate) with a thickness of about 150 $\mu$m. The support piece 16a can prevent the film like wiring mother strip 2a from coming loose when printing the solder paste. Therefore, it is possible to prevent the variation in the solder printing thickness and the blur of the solder printing. As a result, it is possible to precisely and accurately print the solder paste, and consequently to improve the yield.

In the foregoing, the invention made by the inventors of the present invention has been concretely described based on the embodiments. However, it is needless to say that the present invention is not limited to the foregoing embodiments and various modifications and alterations can be made within the scope of the present invention. In the embodiments, the cases where one semiconductor chip is mounted on each semiconductor device forming area has been described. However, it is also possible to apply the present invention to the case where a plurality of semiconductor chips are mounted thereon. In addition, it is also possible to mount passive components such as a chip capacitor and a chip resistor if necessary.

Also, although the structure in which bump electrodes are provided on the rear surface of the substrate is employed, external terminals with different structure are also available.

The advantages achieved by the typical ones of the inventions disclosed in this application will be briefly described as follows.

(1) It is possible to provide a technique for manufacturing a thin semiconductor device.

(2) It is possible to provide a manufacturing method of a thin semiconductor device, capable of reducing the manufacturing cost.

(3) It is possible to provide a technique capable of manufacturing a thin and small semiconductor device at low cost.

What is claimed is:

1. A semiconductor device comprising:
   a wiring substrate with a main surface, a rear surface opposite to the main surface, and side surfaces between the main surface and the rear surface;
   a semiconductor chip fixed to the main surface of the wiring substrate;
   a plurality of connecting means which electrically connect-terminals on the semiconductor chip with corresponding wirings on the main surface of the wiring substrate;
   an encapsulation made of insulating materials which covers the semiconductor chip, the main surface of the wiring substrate and the connecting means; and
   conductors penetrating through the wiring substrate and having one end connected to the wirings on the main surface of the wiring substrate and the other end protruding from the rear surface of the wiring substrate to form external terminals,
   wherein side surfaces of the wiring substrate and of the encapsulation are disposed so as to share common planes extending vertical to the main surface of the wiring substrate,
   wherein the encapsulation, the semiconductor chip, the wiring substrate and the external terminals have respective thicknesses such that the semiconductor chip is thicker than the wiring substrate, the wiring substrate is thicker than the external terminals and the thickness of the semiconductor device between the top surface of the encapsulation and the tip of the external terminal is about 0.5 mm or smaller.

2. The semiconductor device according to claim 1, wherein the thickness of the semiconductor chip is about 100 $\mu$m or smaller, the thickness of the wiring substrate is about 70 $\mu$m or smaller, and the thickness of the external terminal is 30 $\mu$m or smaller.

3. The semiconductor device according to claim 1, wherein a pitch between the terminals arranged in the semiconductor chip is larger than the thickness of the wiring substrate.

4. The semiconductor device according to claim 3, wherein the pitch between the arranged terminals of the semiconductor chip is about 80 to 100 $\mu$m, and the thickness of the wiring substrate is about 70 $\mu$m or smaller.

5. The semiconductor device according to claim 1, wherein the wiring substrate is a film wiring substrate made of insulating resin.

6. The semiconductor device according to claim 1, wherein the semiconductor chip is fixed to the wiring substrate via adhesive, and the terminals of the semiconductor chip and the wirings on the main surface of the wiring substrate are connected by conductive bonding wires.

7. The semiconductor device according to claim 6, wherein the bonding wires are connected to the main surface of the wiring substrate in a first bonding and to the terminals of the semiconductor chip in a second bonding.

8. The semiconductor device according to claim 1, wherein a surface of the external terminal is in an arch shape to form the ball grid array.

9. The semiconductor device according to claim 1, wherein a surface of the external terminal is flat to form the land grid array.

10. A semiconductor device comprising:
    a wiring substrate with a main surface, a rear surface opposite to the main surface, side surfaces, a plurality of wiring layers disposed along the periphery of the main surface, via-holes formed underneath the plurality of wiring layers, and conductors connected to the wiring layers, extending through the via-holes and protruding from the rear surface to form external terminals;
    a semiconductor chip having a main surface formed with a plurality of electrode terminals and a rear surface fixed on a middle portion of the main surface of said wiring substrate;
    bonding wires electrically connecting said electrode terminals with the corresponding wiring layers; and
    an encapsulation of insulating material which encapsulates the semiconductor chip, the main surface of the wiring substrate and the bonding wires;

wherein the encapsulation, the semiconductor chip, the wiring substrate and the external terminals have respective thicknesses such that the semiconductor chip is thicker than the wiring substrate, the wiring substrate is thicker than the external terminals, the thickness of the encapsulation portion placed on the semiconductor chip is larger than that of the semiconductor chip and the thickness of the semiconductor device between the top surface of the encapsulation and the tip of the external terminals is about 0.5 mm or smaller.

11. The semiconductor device according to claim 10, wherein side surfaces of the encapsulation of the wiring substrate are disposed so as to share common planes extending vertical to the main surface of the wiring substrate.

* * * * *